(12) United States Patent
Hayashi et al.

(10) Patent No.: US 9,583,692 B2
(45) Date of Patent: Feb. 28, 2017

(54) PIEZOELECTRIC VIBRATION DEVICE AND PORTABLE TERMINAL USING THE SAME

(75) Inventors: Harumi Hayashi, Kyoto (JP); Kenji Yamakawa, Kyoto (JP); Satoru Iwasaki, Kyoto (JP)

(73) Assignee: KYOCERA CORPORATION (JP)

( * ) Notice: Subject to any disclaimer, the term of this patent is extended or adjusted under 35 U.S.C. 154(b) by 784 days.

(21) Appl. No.: 13/989,311

(22) PCT Filed: Jul. 31, 2012

(86) PCT No.: PCT/JP2012/069415
§ 371 (c)(1),
(2), (4) Date: May 23, 2013

(87) PCT Pub. No.: WO2013/051328
PCT Pub. Date: Apr. 11, 2013

(65) Prior Publication Data
US 2013/0241352 A1    Sep. 19, 2013

(30) Foreign Application Priority Data

Oct. 3, 2011   (JP) ................. 2011-218867
Oct. 28, 2011  (JP) ................. 2011-237453
Jan. 31, 2012  (JP) ................. 2012-018401

(51) Int. Cl.
*H01L 41/09*    (2006.01)
*H04M 1/03*    (2006.01)
(Continued)

(52) U.S. Cl.
CPC .......... *H01L 41/0926* (2013.01); *H04M 1/03* (2013.01); *H04R 7/045* (2013.01); *H04M 1/0266* (2013.01);
(Continued)

(58) Field of Classification Search
USPC ................. 310/324, 328, 348, 366
See application file for complete search history.

(56) References Cited

U.S. PATENT DOCUMENTS 4,204,096 A * 5/1980 Barcus et al. ................. 381/348
5,801,474 A * 9/1998 Sakairi ..................... 310/313 R
(Continued)

FOREIGN PATENT DOCUMENTS

| CN | 1422102 A | 6/2003 |
|----|-----------|--------|
| JP | 2004187031 A | 7/2004 |

(Continued)

OTHER PUBLICATIONS

International Search Report, PCT/JP2012/069415, Sep. 28, 2012, 1 pp.

(Continued)

*Primary Examiner* — Thomas Dougherty
(74) *Attorney, Agent, or Firm* — Volpe and Koenig, P.C.

(57) ABSTRACT

A piezoelectric vibration device capable of allowing a low profile and generating strong vibration, and a portable terminal using the same are provided. Disclosed are a piezoelectric vibration device at least including a support body (11); a vibration member (12) mounted to the support body (11) so as to vibrate; a vibration element (14) capable of being subjected to bending vibration; and a deformable first connecting member (13) interposed between a first surface that is a bending surface of the vibration element (14) and one main surface of the vibration member (12), and a portable terminal using the same. A piezoelectric vibration device capable of allowing a low profile and generating strong vibration, and a portable terminal can be obtained.

6 Claims, 6 Drawing Sheets

(51) Int. Cl.
*H04R 7/04* (2006.01)
*H04R 17/00* (2006.01)
*H04M 1/02* (2006.01)

(52) U.S. Cl.
CPC ......... *H04M 2250/22* (2013.01); *H04R 17/00* (2013.01); *H04R 2499/11* (2013.01); *H04R 2499/15* (2013.01)

(56) References Cited

U.S. PATENT DOCUMENTS

| | | | |
|---|---|---|---|
| 6,087,760 A * | 7/2000 | Yamaguchi et al. | 310/334 |
| 6,795,561 B1 * | 9/2004 | Bank | 381/152 |
| 9,070,864 B2 * | 6/2015 | Hayashi | H04M 1/03 |
| 2003/0099371 A1 | 5/2003 | Ogura et al. | |
| 2005/0023937 A1 * | 2/2005 | Sashida et al. | 310/348 |
| 2010/0038998 A1 * | 2/2010 | Onishi | H04R 17/00 310/334 |
| 2010/0246863 A1 * | 9/2010 | Onishi | H04R 17/00 381/190 |
| 2011/0002485 A1 * | 1/2011 | Onishi | B06B 1/0603 381/190 |
| 2012/0105333 A1 * | 5/2012 | Maschmeyer et al. | 345/173 |
| 2013/0271418 A1 * | 10/2013 | Ishii et al. | 345/173 |
| 2014/0028153 A1 * | 1/2014 | Smirnov | 310/328 |
| 2015/0023530 A1 * | 1/2015 | Takahashi et al. | 381/190 |

FOREIGN PATENT DOCUMENTS

| | | | | |
|---|---|---|---|---|
| JP | EP 1 544 720 A1 * | 6/2005 | | G06F 3/033 |
| JP | 2006238072 A | 9/2006 | | |
| JP | 2007082009 A | 3/2007 | | |
| JP | 4779526 B2 | 9/2011 | | |
| WO | 2010106736 A1 | 9/2010 | | |

OTHER PUBLICATIONS

Chinese Office Action with concise English explanation, Chinese Patent Application No. 201280035498.4, Nov. 2, 2015, 7 pgs.

* cited by examiner

PIEZOELECTRIC VIBRATION DEVICE AND PORTABLE TERMINAL USING THE SAME

FIELD OF INVENTION

The present invention relates to a piezoelectric vibration device and a portable terminal using the same.

BACKGROUND

In the related art, a piezoelectric vibration device has been proposed, in which a plate-like piezoelectric bimorph element and a vibration plate are disposed with an interval and one end of the piezoelectric bimorph element in a length direction thereof, is fixed to the vibration plate (for example, refer to Patent Literature 1).

CITATION LIST

Patent Literature

Patent Literature 1: Japanese Unexamined Patent Publication JP-A 2006-238072

SUMMARY

Technical Problem

However, in the piezoelectric vibration device of the related art described above, a sufficient interval is required to open between a piezoelectric bimorph element and a vibration plate so that the piezoelectric bimorph element and the vibration plate do not make contact with each other, even though an impact is applied to the piezoelectric vibration device. Accordingly, there is a problem that it is difficult to make the device thinner. In addition, a piezoelectric vibration device has been known in which one side of a main surface of the piezoelectric element is fixed to one side of a main surface of the vibration plate and then the piezoelectric element is subjected to stretching vibration, thereby a connecting body of the piezoelectric element and the vibration plate is subjected to bending vibration; however, there is a problem that it is difficult to obtain strong vibration in such a piezoelectric vibration device.

The invention is made in view of the above-described problems in the related art and an object of the invention is to provide a piezoelectric vibration device which can generate strong vibration and have a low profile and a portable terminal using the piezoelectric vibration device.

Solution to Problem

A piezoelectric vibration device of the invention comprises at least: a support body, a vibration member mounted to the support body so as to vibrate, a vibration element capable of being subjected to bending vibration, and a deformable first connecting member interposed between a first surface that is a bending surface of the vibration element and one main surface of the vibration member, and connecting the first surface of the vibration element and one main surface of the vibration member.

A portable terminal of the invention comprises at least: an electronic circuit, a display, the above-described piezoelectric vibration device, and a casing, the vibration member being the display, a part of the display, or a cover of the display, and the support body being fixed to the casing or at least a part of the casing being the support body.

Advantageous Effects of Invention

According to the piezoelectric vibration device of the invention, it is possible to obtain the piezoelectric vibration device which can have a low profile and generates a strong vibration. According to the portable terminal of the invention, it is possible to obtain the portable terminal which can be made in a low profile.

DETAILED DESCRIPTION OF THE PREFERRED EMBODIMENTS

Figure 1:
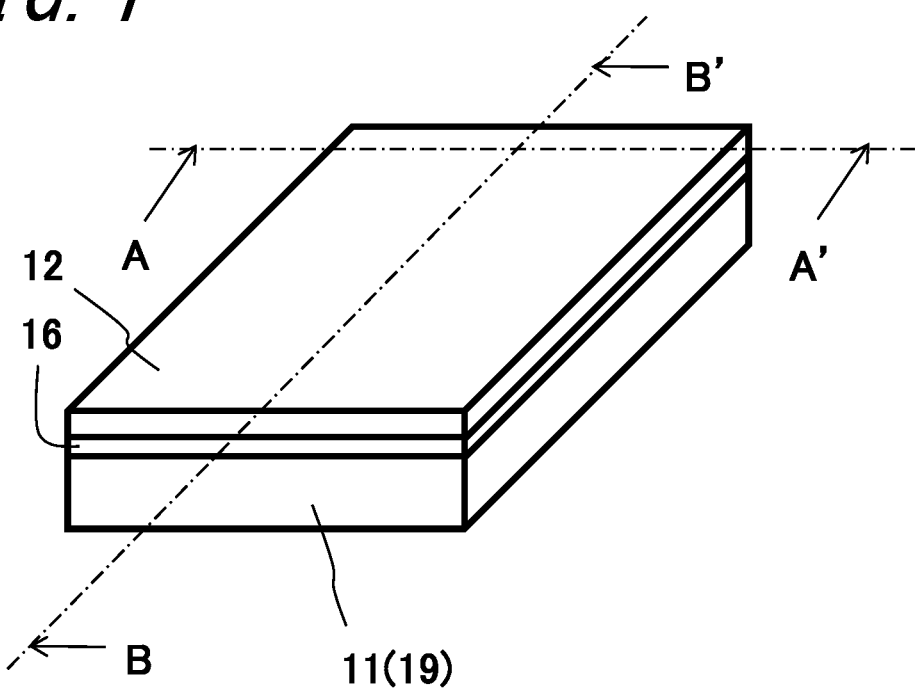
FIG. 1 is a perspective view schematically illustrating a piezoelectric vibration device and a portable terminal according to an embodiment of the invention.
Figure 2:
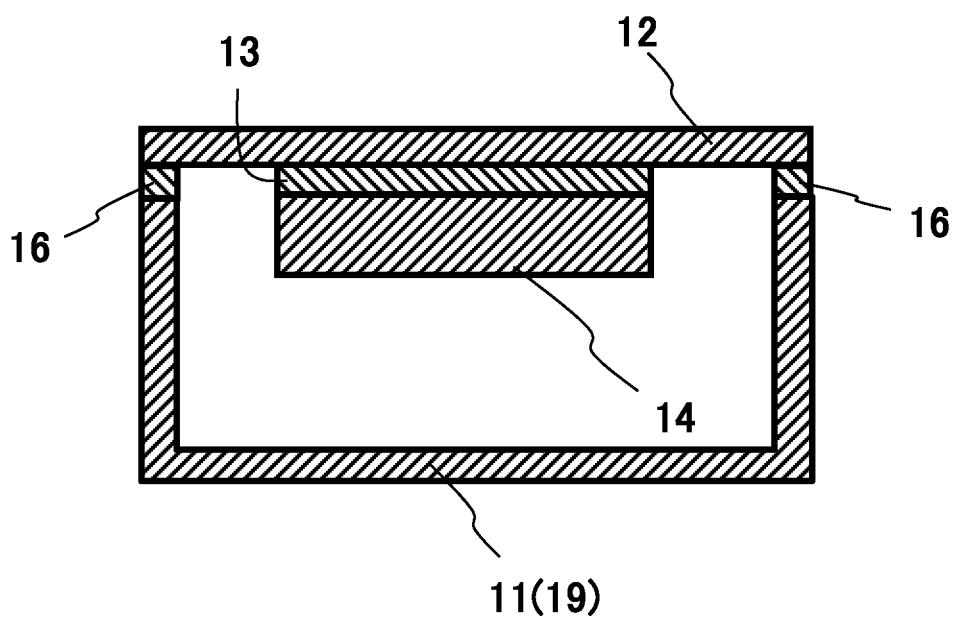
FIG. 2 is a cross-sectional view taken along the line A-A' in FIG. 1.
Figure 3:
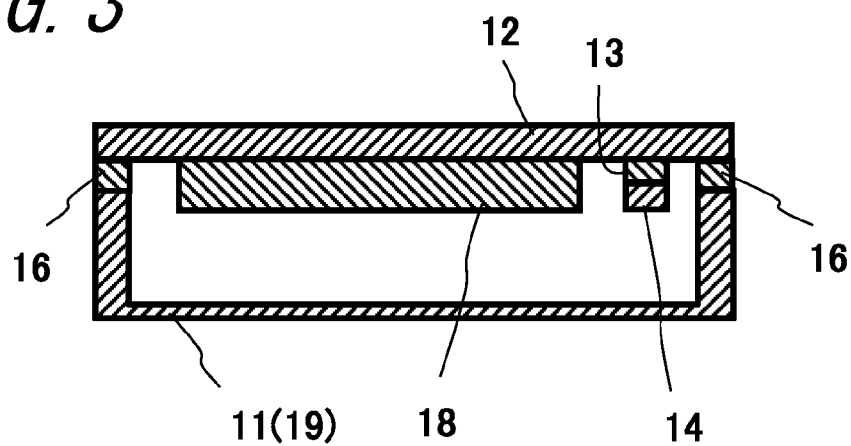
FIG. 3 is a cross-sectional view taken along the line B-B' in FIG. 1.

Hereinafter, a piezoelectric vibration device and a portable terminal according to the invention will be described in detail with reference to the accompanying drawings. FIG. 1 is a perspective view schematically illustrating a piezoelectric vibration device and a portable terminal according to an embodiment of the invention. FIG. 2 is a cross-sectional view taken along the line A-A' in FIG. 1. FIG. 3 is a cross-sectional view taken along the line B-B' in FIG. 1.

As shown in FIGS. 1 to 3, the piezoelectric vibration device of the embodiment includes a support body 11, a vibration plate 12, a first connecting member 13, a vibration element 14, and a second connecting member 16. Further, a portable terminal of the embodiment includes a display 18 and an electronic circuit (not shown), in addition to the piezoelectric vibration device. Here, the support body 11 of the piezoelectric vibration device functions as a casing 19 in the portable terminal, and the vibration plate 12 of the piezoelectric vibration device functions as a cover of the display 18 in the portable terminal.

A support body 11 has a box shape of which one surface is opened. The support body 11 can be formed by preferably using a material such as synthetic resin having a high rigidity and elasticity. Then, the support body 11 functions as a support body which supports a vibration plate 12 so as to be able to vibrate in the piezoelectric vibration device and functions as a casing 19 in the portable terminal.

The vibration plate 12 has a thin plate shape. The vibration plate 12 may be formed by favorably using a material having a high rigidity and elasticity such as an acrylic resin or glass. Further, the vibration plate 12 is fixed to the support body 11 through the second connecting member 16 only in the periphery of one main surface of the vibration plate 12, and is mounted to the support body 11 to be able to vibrate. The thickness of the vibration plate 12 is set to about 0.4 mm to 1.5 mm, for example.

A first connecting member 13 has a film shape. In addition, the first connecting member 13 is formed of a material that is softer than that of the vibration plate 12 and is easy to be deformed. In addition, the first connecting member 13 is lower in elasticity and rigidity such as a Young's modulus, a rigidity modulus, and a volume elasticity modulus than the vibration plate 12. In other words, the first connecting member 13 is deformable and is greatly deformed compared with the vibration plate 12 when the same force is applied thereto. In addition, one main surface of the first connecting member 13 is entirely fixed to a portion of one main surface of the vibration plate 12 and one main surface of the vibration element 14 is entirely fixed to the other main surface of the first connecting member 13. In other words, the vibration plate 12 and the vibration element 14 are connected by the first connecting member 13. In addition, the first connecting member 13 may be a single member or a composite body composed of some members. As such a first connecting member 13, various elastic adhesives or the like, which are adhesives having elasticity, for example, can be preferably used.

In addition, as the first connecting member 13, it is preferable to use a material including a base material and adhesive layers composed of an adhesive and disposed on both sides of the base material, the base material being composed of an adhesive that is a viscoelastic material and a non-woven fabric, and more specifically, the base material being configured so that the non-woven fabric is impregnated with the adhesive, that is, the base material having a configuration in which the adhesive (the viscoelastic material) enters between fibers of the non-woven fabric. Then, it is preferable that at least a portion of the base material is configured of the adhesive (the viscoelastic material) over the entire base material in a thickness direction (a direction directed from one adhesive layer to the other adhesive layer of two adhesive layers disposed on both sides of the base material) thereof. In other words, it is preferable that at least a portion of the first connecting member 13 is configured of the viscoelastic material over the entire first connecting member 13 in the thickness direction (a direction directed from one side of the vibration element 14 and the vibration plate 12 to the other side, that is, the thickness direction of the base material) thereof. Accordingly, a heat stress acting on between the vibration plate 12 and the vibration element 14 is alleviated, and the vibration of the vibration element 14 can be favorably transmitted to the vibration plate 12.

In other words, the heat stress (a stress acting between two materials of which coefficient of thermal expansions are different from each other due to change in the temperature) acting between the vibration plate 12, the vibration element 14 and the first connecting member 13 can be alleviated by the deformation of the viscoelastic material because of characteristics of the viscoelastic material in which the elasticity is strong for the fast movement and the viscosity is strong for the slow movement. In addition, the vibration of the vibration element 14 in which displacement directions thereof are reversed in a very short time can be transmitted to the vibration plate 12 without being attenuated. Accordingly, a piezoelectric vibration device can be obtained, in which strong vibration can be generated and damage thereof unlikely occurs. The effects can be increased by configuring at least a portion of the first connecting member 13 with the viscoelastic material over the entire first connecting member 13 in the thickness direction thereof.

In addition, it is important that the vibration element 14 is independently subjected to bending vibration. Accordingly, the attenuation of the vibration due to the non-woven fabric can be reduced compared to a case where the vibration element 14 is subjected to stretching vibration. In addition, it is preferable that the thicknesses of the vibration element 14 and the vibration plate 12 are equal (substantially equal) to each other, and that the first connecting member 13 is positioned on the center portion of a composite body configured of the vibration element 14, the vibration plate 12 and the first connecting member 13 in a vibration direction. Accordingly, the attenuation of the vibration due to the first connecting member 13 can be reduced. Furthermore, it is preferable that the thicknesses of the two adhesive layers are equal to each other, and the base material be positioned on the center portion of the composite body configured of the vibration element 14, the vibration plate 12 and the first connecting member 13 in the vibration direction. Accordingly, the attenuation of the vibration due to the base material (the non-woven fabric configuring the base material) can be reduced.

Figure 4:
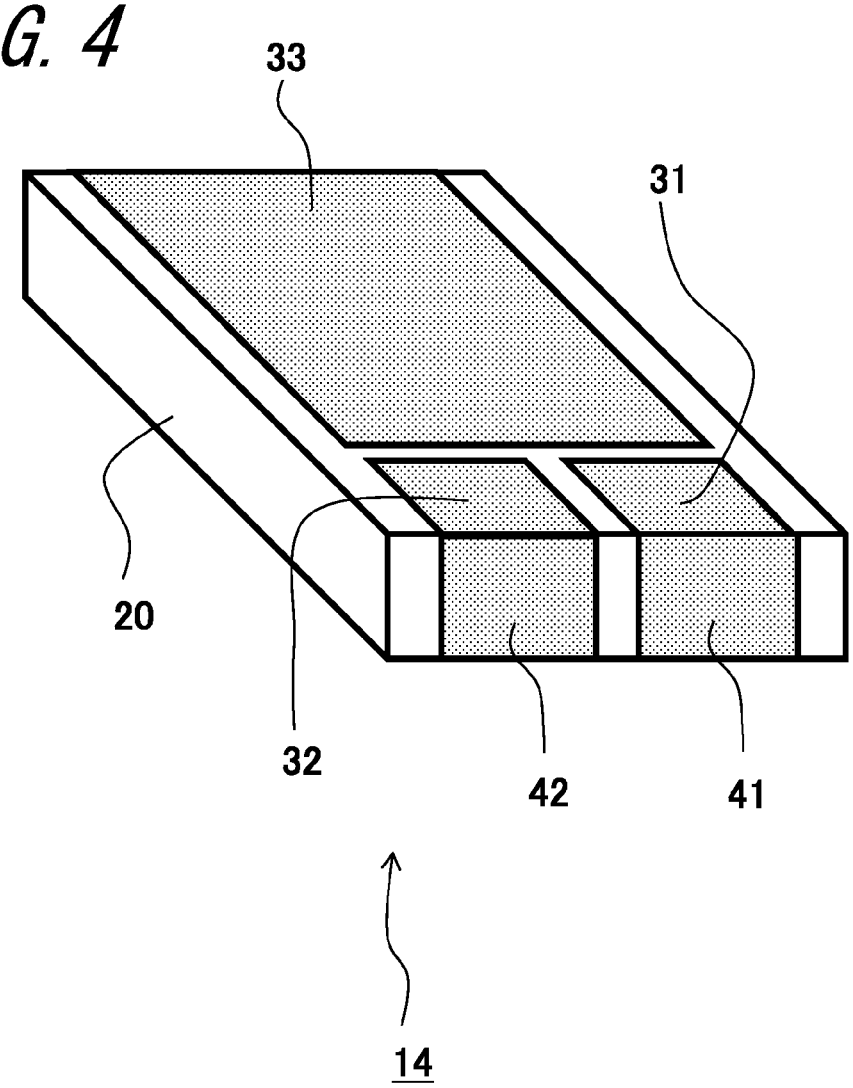
FIG. 4 is a perspective view schematically illustrating the vibration element 14 in FIG. 2 and FIG. 3.

The vibration element 14 has a plate shape and one main surface thereof is entirely connected to the other main surface of the first connecting member 13. In addition, as illustrated in FIG. 4, the vibration element 14 has a stacked body 20, surface electrodes 31, 32 and 33, a first connection electrode 41, a second connection electrode 42 and a third connection electrode (not shown). FIG. 4 is a perspective view schematically illustrating the vibration element 14.

Figure 5:
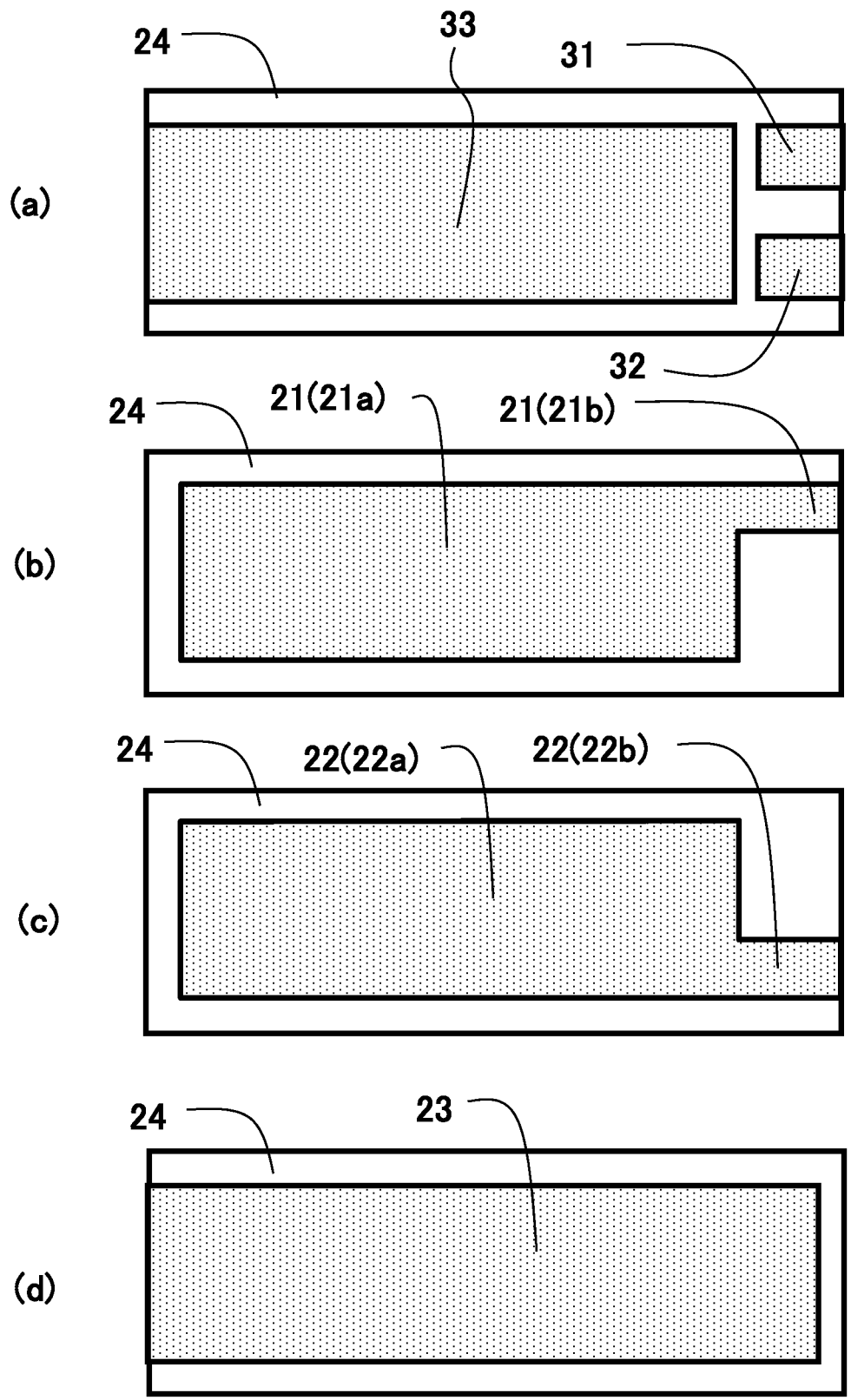
FIGS. 5(a) to 5(d) are views for explaining a structure of a vibration element 14.

The stacked body 20 is configured such that a plurality of polarized piezoelectric body layers 24 and a plurality of internal electrodes 21, 22 and 23 illustrated in FIG. 5 are stacked in the thickness direction of the vibration element 14. In other words, one end surface of the vibration element 14 in a stacking direction of the stacked body 20 is entirely connected to the other main surface of the first connecting member 13. In other words, one end surface (one main surface) of the vibration element 14 in a stacking direction of the stacked body 20 is entirely connected and fixed to one main surface of the vibration plate 12 via the first connecting member 13.

FIGS. 5(a) to 5(d) are schematic plan views for explaining the surface electrodes 31, 32 and 33 and the internal electrodes 21, 22 and 23 included in the vibration element 14. As illustrated in FIG. 5(a), the surface electrodes 31, 32 and 33 are disposed on each of both main surfaces of the stacked body 20. In addition, the plurality of internal electrodes 21 illustrated in FIG. 5(b), the plurality of internal electrodes 22 illustrated in FIG. 5(c) and the plurality of internal electrodes 23 illustrated in FIG. 5(d) are disposed inside the stacked body 20, respectively.

As illustrated in FIG. 5, the internal electrode 21 has a structure in which a rectangular extension section 21b of which one end is exposed to a side surface of the stacked body 20 is connected to one end of a rectangular body section 21a which is formed across a substantially entire surface of the piezoelectric body layer 24 in the longitudinal direction with an interval with respect to the side surface of the stacked body 20. In addition, one end of the extension section 21b is exposed to the side surface of the stacked body 20 in one end of the stacked body 20 in the longitudinal direction thereof.

As illustrated in FIG. 5, the internal electrode 22 has a structure in which a rectangular extension section 22b of which one end is exposed to the side surface of the stacked body 20 is connected to one end of a rectangular body section 22a which is formed across a substantially entire surface of the piezoelectric body layer 24 in the longitudinal direction thereof with an interval with respect to the side surface of the stacked body 20. In addition, one end of the extension section 22b is exposed to the side surface of the stacked body 20 in one end of the stacked body 20 in the longitudinal direction thereof.

As illustrated in FIG. 5, the internal electrode 23 has a rectangular shape formed across a substantially entire surface of the piezoelectric body layer 24. In addition, as for the internal electrode 23, only one end in the longitudinal direction is exposed to the side surface of the stacked body 20 and the other ends has intervals with respect to the side surfaces of the stacked body 20. In addition, one end of the internal electrode 23 is exposed to the side surface of the stacked body 20 in the other end of the stacked body 20 in the longitudinal direction thereof. In addition, the extension section 21b and the extension section 22b are disposed with an interval in the width direction of the stacked body 20 so that they are not overlapped in the thickness direction (the stacking direction) of the stacked body 20.

As illustrated in FIG. 5, the surface electrode 33 has a rectangular shape. In addition, as for the surface electrode 33, only one end in the longitudinal direction is exposed to the side surface of the stacked body 20 and the other ends has intervals with respect to the side surfaces of the stacked body 20. The surface electrode 33 is formed across a region of 80% or more of the stacked body 20 in the longitudinal direction thereof. In addition, one end of the surface electrode 33 is exposed to the side surface of the stacked body 20 in the other end of the stacked body 20 in the longitudinal direction thereof.

The surface electrode 31 and the surface electrode 32 are disposed between one end of the stacked body 20 in the longitudinal direction thereof and the other end of the surface electrode 33 in the longitudinal direction thereof with an interval in the width direction of the stacked body 20. The surface electrode 31 and the surface electrode 32 have rectangular shapes and one ends thereof in the longitudinal direction are exposed to the side surface of the stacked body 20 in one end of the stacked body 20 in the longitudinal direction thereof. In addition, the surface electrode 31 and the surface electrode 32 have intervals between the other ends in the longitudinal direction and the surface electrode 33, and are disposed with an interval with respect to the side surface of the stacked body 20 in the width direction of the stacked body 20.

Figure 6:
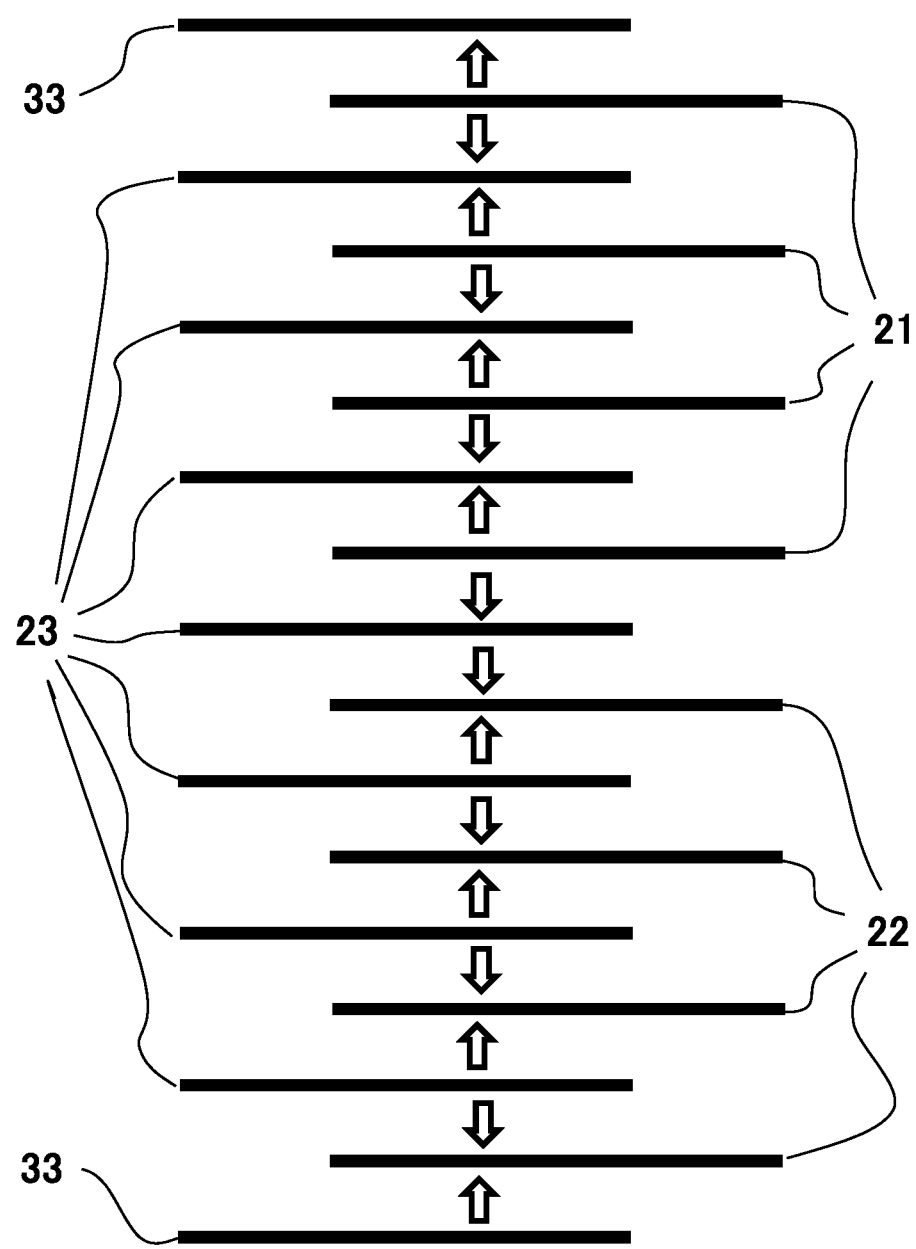
FIG. 6 is a view for explaining the structure of the vibration element 14.

In addition, the stacked body 20 is configured such that the internal electrodes 21, 22 and 23 and the piezoelectric body layer 24 are alternately disposed in the stacking direction. FIG. 6 is a schematic view illustrating a disposition of the surface electrode 33 and the internal electrodes 21, 22 and 23 in the vibration element 14, and a polarization direction in the piezoelectric body layer 24 disposed between the surface electrode 33 and the internal electrodes 21, 22 and 23. As illustrated in FIG. 6, the internal electrode 21 or the internal electrode 22 and the surface electrode 33 or the internal electrode 23 are alternately disposed in the stacking direction of the stacked body 20. In addition, the internal electrode 21 and the internal electrode 23 or the surface electrode 33 are alternately disposed on one side of the stacked body 20 in the stacking direction thereof. In addition, the internal electrode 22 and the internal electrode 23 or the surface electrode 33 are alternately disposed on the other side of the stacked body 20 in the stacking direction thereof. In other words, the piezoelectric vibration element 14 has a configuration in which a plurality of electrode layers (a planar electrode) composed of the surface electrode 33 and the internal electrodes 21, 22 and 23, and a plurality of piezoelectric body layers 24 are alternately stacked.

The plurality of internal electrodes 21 are configured such that end portions of the extension section 21b exposed to the side surface of the stacked body 20 are connected to each other by the first connection electrode 41 on one end portion of the stacked body 20 in the longitudinal direction thereof. Furthermore, the plurality of internal electrodes 21 are connected to the surface electrodes 31 disposed on the both main surfaces of the stacked body 20, respectively via the first connection electrode 41.

In addition, the plurality of internal electrodes 22 are configured such that end portions of the extension section 22b exposed to the side surface of the stacked body 20 are connected to each other by the second connection electrode 42 on one end portion of the stacked body 20 in the longitudinal direction thereof. Furthermore, the plurality of internal electrodes 22 are connected to the surface electrodes 32 disposed on the both main surfaces of the stacked body 20, respectively via the second connection electrode 42.

Then, the plurality of internal electrodes 23 are configured such that end portions thereof exposed to the side surface of the stacked body 20 are connected to each other by a third connection electrode (not shown) on the other end portion of the stacked body 20 in the longitudinal direction thereof. Furthermore, the plurality of internal electrodes 23 are connected to the surface electrodes 33 disposed on the both main surfaces of the stacked body 20, respectively via the third connection electrode (not shown). As described above, the surface electrodes 31, 32 and 33 function as a terminal electrode in the vibration element 14. The application of the voltage at the time of the polarization of the piezoelectric body layer 24 and the application of the voltage at the time of vibrating the vibration element 14 can be performed to only any one of main surfaces of the vibration element 14 (the stacked body 20) by disposing the entire surface electrodes 31, 32 and 33 on the both main surfaces of the stacked body 20, respectively.

In addition, the piezoelectric body layer 24 disposed between the internal electrodes 21, 22 and 23 is polarized in an arrow direction illustrated in FIG. 6. For example, such a polarization can be performed by applying the direct voltage to the surface electrodes 31, 32 and 33 so that a potential of the surface electrode 31 is higher and the potential of the surface electrode 32 is lower compared to the surface electrode 33. Then, at the time of vibrating the vibration element 14, the alternative voltage is applied to the surface electrodes 31, 32 and 33 so that the surface electrode 31 and the surface electrode 32 come to have the same potential and have a potential difference from the surface electrode 33. Accordingly, the vibration element 14 is configured such that the polarization direction with respect to the direction of the electric field which is applied at a certain moment is reversed in one side half and the other side half in the thickness direction of the vibration element 14.

In other words, for example, when one side half of the vibration element 14 in the thickness direction is extended in the longitudinal direction of the vibration element 14 at a certain moment by application of an electric signal, the other side half of the vibration element 14 in the thickness direction is contracted in the longitudinal direction of the vibration element 14. Accordingly, the vibration element 14 can be independently subjected to bending vibration by application of the electric signal. As described above, the vibration element 14 is configured of the piezoelectric body (the piezoelectric bimorph element) having a bimorph structure.

In addition, the vibration element 14 is subjected to bending vibration so that one main surface and the other main surface are bent. Accordingly, the first connecting member 13 is interposed between the first surface (one main surface) that is a bending surface of the vibration element 14 and one main surface of the vibration plate 12, to connect the first surface of the vibration element 14 and one main surface of the vibration plate 12. In other words, the first connecting member 13 fixes entirely the first surface of the vibration element 14 to the vibration plate 12. In addition, the state of being entirely fixed (connected) includes a state where the entirety of the first surface (one main surface) of the vibration element 14 is fixed (connected) and a state where substantially the entire surface is fixed (connected). In addition, the thickness of the first connecting member 13 is set to be greater than amplitudes of the bending vibration of the vibration element 14 and is set so as to avoid excessive attenuation of vibration ascribable to too large a thickness, for example, approximately 0.1 mm to 0.6 mm.

For example, the stacked body 20 is preferably a substantially rectangular parallelepiped shape. For example, the length of the stacked body 20 is preferably about 18 mm to 28 mm, and more preferably about 22 mm to 25 mm. For example, the width of the stacked body 20 is preferably about 1 mm to 6 mm, and more preferably about 3 mm to 4 mm. For example, the thickness of the stacked body 20 is preferably about 0.2 mm to 1.0 mm, and more preferably about 0.4 mm to 0.8 mm. For example, the length of the body section 21a of the internal electrode 21 and the body section 22a of the internal electrode 22 is preferably about 17 mm to 25 mm, and more preferably about 21 mm to 24 mm. For example, the length of the internal electrode 23 is preferably about 19 mm to 27 mm, and more preferably about 22 mm to 24 mm. For example, the length of the surface electrode 33 is preferably about 17 mm to 23 mm, and more preferably about 19 mm to 21 mm. For example, the width of the body section 21a of the internal electrode 21, the body section 22a of the internal electrode 22, the internal electrode 23 and the surface electrode 31 is preferably about 1 mm to 5 mm, and more preferably about 2 mm to 4 mm. For example, the length of the surface electrode 31 and the surface electrode 32 is preferably 1 mm to 3 mm. For example, the width of the surface electrode 31 and the surface electrode 32 is preferably 0.5 mm to 1.5 mm. The small-sized vibration element 14 capable of generating strong vibration can be obtained by using the stacked body 20 having such a shape.

For example, the piezoelectric body layer 24 configuring the stacked body 20 can be formed by using lead zirconate (PZ), lead zirconate titanate (PZT), or a non-lead piezoelectric material such as a Bi layered compound or a tungsten bronze structure compound, but other piezoelectric material can be used. For example, the thickness of one layer of the piezoelectric body layer 24 is preferably set to be approximately 0.01 mm to 0.1 mm for being driven in a low voltage. In addition, in order to obtain a large bending vibration, a piezoelectric d31 constant is preferably 200 pm/V or more. For example, the internal electrodes 21, 22 and 23 constituting the vibration element 14 are preferably formed by using a material which contains a ceramic component or a glass component in addition to the metal component such as silver or an alloy of silver and palladium, however, the internal electrodes 21, 22 and 23 may be formed by using other known metal materials.

The vibration element 14 having such a configuration may be manufactured by the following method, for example. First, a binder, a dispersing agent, a plasticizer and a solvent are added to powder of a piezoelectric material, and the mixture is stirred to manufacture slurry. Then, the obtained slurry is molded in a sheet form to manufacture a green sheet. Then, conductive paste is printed on the green sheet to form electrode layer patterns which will turn to the internal electrodes 21, 22 and 23. Then, the green sheets bearing the electrode layer patterns are stacked on top of each other to manufacture a stacked molded product. After that, the stacked molded product is subjected to degreasing treatment and firing process, and is then cut into a predetermined dimension, whereupon a stacked body can be obtained. Next, after the printing of a conductor paste for the formation of the surface electrodes 31, 32 and 33, the first connection electrode 41, the second connection electrode 42 and the third connection electrode (not shown) with subsequent baking process at a predetermined temperature, a direct-current voltage is applied to the stacked body through the surface electrodes 31, 32 and 33 to effect polarization of the piezoelectric layers 24. In this way, the vibration element 14 can be obtained.

A second connecting member 16 has a film shape. In addition, the second connecting member 16 is formed to be softer and be easy to be deformed than the vibration plate 12. In addition, the second connecting member 16 is lower in elasticity and rigidity such as a Young's modulus, a rigidity modulus and a volume elasticity modulus than the vibration plate 12. In other words, the second connecting member 16 is deformable and is deformed greater than the vibration plate 12 when the same force is applied thereto. In addition, one main surface of the second connecting member 16 is entirely fixed to the periphery of one main surface of the vibration plate 12, and the other main surface of the second connecting member 16 is entirely fixed to the support body 11 (casing 19). In other words, the vibration plate 12 and the support body 11 (casing 19) are connected via the second connecting member 16. In addition, the second connecting member 16 may be a single member or a composite body composed of some members. For such a second connecting member 16, for example, the same material used for the first connecting member 13 can be preferably used. In addition, the thickness of the second connecting member 16 is set so as to avoid excessive attenuation of vibration ascribable to too large a thickness, and for example, the thickness is set to be approximately 0.1 mm to 0.6 mm. In other words, the second connecting member 16 is formed capable of transmitting the vibration of the vibration plate 12 to the support body 11 (casing 19).

As the electronic circuit (not shown), for example, a circuit that processes image information to be displayed on the display 18 or sound information to be transmitted by the piezoelectric vibration device, a communication circuit, or the like may be exemplified. At least one of these circuits may be included, or all of these circuits may be included. Further, a circuit having a different function may be used. In addition, a plurality of electronic circuits may be included.

The display 18 is a display apparatus that includes a function of displaying image information, and for example, known displays such as a liquid crystal display, a plasma display or an organic EL display may be preferably used.

Figure 7:
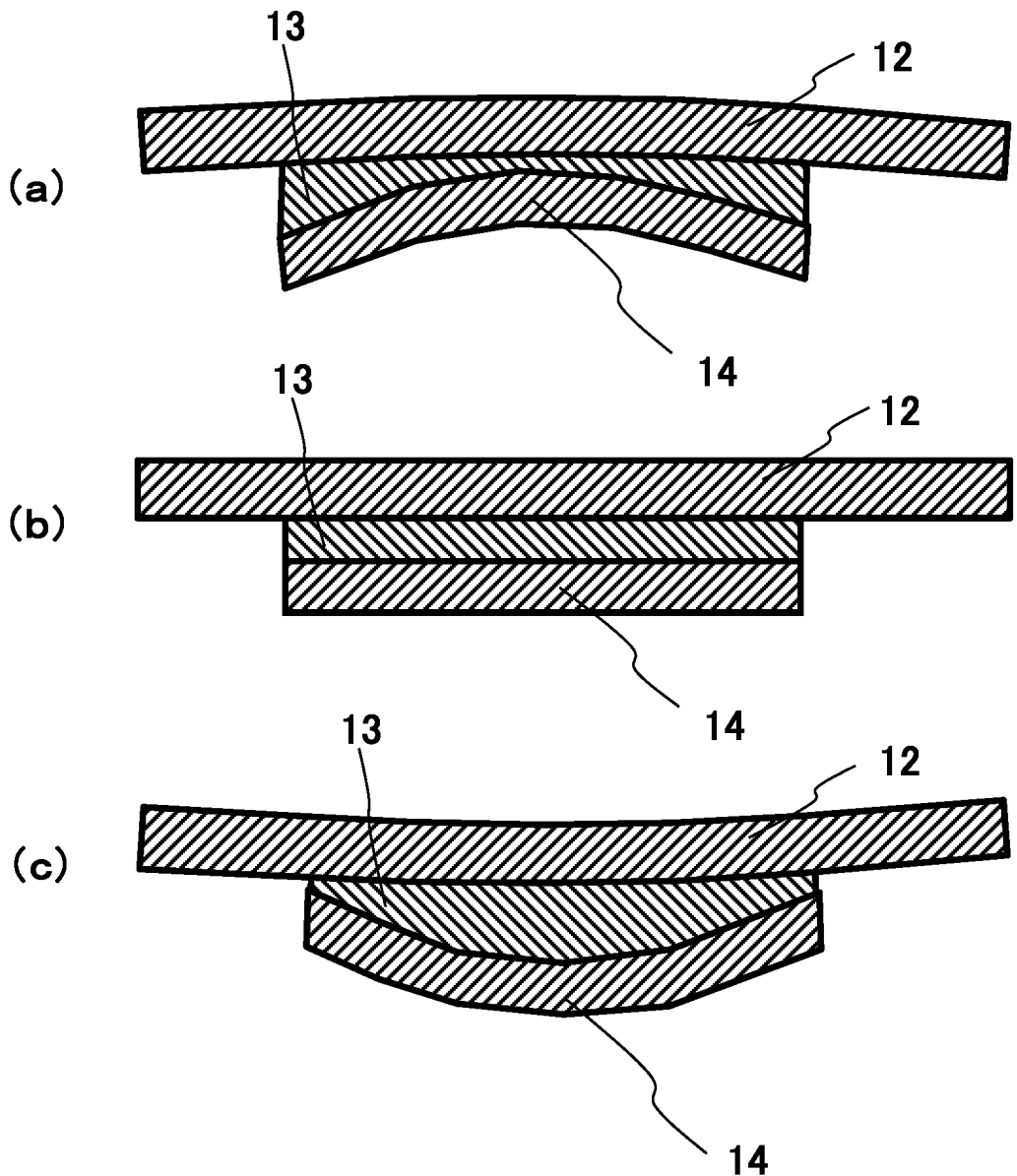
FIGS. 7(a) to 7(c) are cross-sectional views schematically illustrating a vibration state in the piezoelectric vibration device of an embodiment of the invention.

FIGS. 7(a) to 7(c) are cross-sectional views schematically illustrating a vibration state in the piezoelectric vibration device according to the embodiment. In FIGS. 7(a) to 7(c), the second connecting member 16, the support body 11, the display 18 and the electronic circuit are not shown.

As described above, the piezoelectric vibration device of the embodiment is configured such that one main surface of the plate-like vibration element 14 capable of being independently subjected to bending vibration vibrating by application of an electric signal to the vibration element 14 is connected to the vibration plate 12 via the deformable first connecting member 13. Accordingly, when the vibration element 14 is subjected to bending vibration by application of the electric signal, the first connecting member 13 transmits the vibration of the vibration element 14 to the vibration plate 12 while permitting the vibration of the vibration element 14 by its own deformation. Accordingly, in the piezoelectric vibration device of the embodiment, the vibration plate 12 can strongly vibrate by application of the electric signal.

For example, in the state shown in FIG. 7(a), the vibration element 14 is bent to be convex upward in the figure, and the vibration plate 12 is bent to be convex upward but the bending amount of the vibration plate 12 is smaller than that of the vibration element 14. That is, the first connecting member 13 is deformed so that an interval between the vibration element 14 and the vibration plate 12 is small at its central portion and is large at its periphery.

Further, in the state shown in FIG. 7(c), the vibration element 14 is bent to be convex downward in the figure, and the vibration plate 12 is bent to be convex downward but the bending amount of the vibration plate 12 is smaller than that of the vibration element 14. That is, the first connecting member 13 is deformed so that an interval between the vibration element 14 and the vibration plate 12 is large at its central portion and is small at its periphery.

In this way, the vibration element 14 and the vibration plate 12 vibrate so that the magnitude relationship in the interval between the vibration element 14 and the vibration plate 12 at the central portion and the periphery in a region where the vibration member 14 and the vibration plate 12 face each other through the first connecting member 13 is periodically reversed by application of an electric signal. Thus, the degree of interruption of vibration of the vibration element 14 is reduced, and it is possible to strongly vibrate the vibration plate 12.

In other words, in the piezoelectric vibration device of the embodiment, the vibration element 14 vibrates by application of the electric signal, and the portion of the vibration plate 12 to which the vibration element 14 is mounted vibrates with an amplitude smaller than that of the vibration element 14 by deforming the first connecting member 13. In other words, the vibration plate 12 vibrates with the amplitude smaller than that of the vibration element 14 in the region in which the vibration plate 12 and the vibration element 14 are opposed to each other via the first connecting member 13 of the vibration plate 12 and the vibration element 14. Accordingly, it is possible to reduce interruption of vibration of the vibration element 14 and strongly vibrate the vibration plate 12. In addition, even though the vibration of the vibration plate 12 is suppressed with the vibration plate 12 brought into contact with other objects such as a human body, the vibration element 14 can vibrate largely and the vibration of the vibration element 14 can be transmitted to other objects such as a human body via the vibration plate 12 with reduced attenuation.

In addition, the amplitudes of the vibration plate 12 and the vibration element 14 can be measured by using a laser Doppler vibrometer. In other words, the amplitude of the vibration plate 12 can be measured by irradiating the laser of the laser Doppler vibrometer on the surface opposite to the side connected to the vibration element 14 of the vibration plate 12. In addition, the amplitude of the vibration element 14 can be measured by irradiating the laser of the laser Doppler vibrometer on the surface opposite to the side connected to the vibration plate 12 of the vibration element 14. As the laser Doppler vibrometer, for example, LV-1710 manufactured by ONO SOKKI CO., LTD. may be used. Then the gauge is connected to an FET analyzer and the amplitude can be known by reading a value displayed on a screen of a personal computer. As the FET analyzer, for example, DS-0290 manufactured by ONO SOKKI CO., LTD. can be used. In addition, in the piezoelectric vibration device of the embodiment, since the thickness of the first connecting member 13 is greater than the amplitudes of the bending vibration of the vibration element 14, it is possible to reduce interruption of vibration of the vibration element 14. Accordingly, the piezoelectric vibration device capable of strongly vibrating the vibration plate 12 can be obtained. In addition, the thickness of the first connecting member 13 can be preferably greater than the amplitude when the vibration element 14 vibrates independently.

Further, in the piezoelectric vibration device of the embodiment, the first connecting member 13 is formed of a material that is softer than that of the vibration plate 12 and is easy to be deformed, and is lower than the vibration plate 12 in an elastic modulus or rigidity such as a Young's modulus, a rigidity modulus or a volume elasticity modulus. That is, the first connecting member 13 is deformable, and is greatly deformed compared with the vibration plate 12 when the same force is applied thereto. Further, it is possible to reduce interruption of vibration of the vibration element 14 and to strongly vibrate the vibration plate 12.

For example, in a case where the first connecting member 13 is rigid and is hard to be deformed, the vibration element 14 and the vibration plate 12 vibrate with almost the same amplitude, but in this case, a problem arises in which vibration of the vibration element 14 is noticeably interrupted. It is hard to clearly specify the reason for the problem, but the reason may be presumed as follows. That is, for example, as shown in FIG. 7(c), in a case where the vibration element 14 is deformed to be convex downward, the upper half (on the vibration plate 12 side) of the vibration element 14 in the thickness direction shrinks in the length direction. Then, the vibration plate 12 connected to the upper half (on the vibration plate 12 side) of the vibration element 14 in the thickness direction tries to be deformed to be convex upward. Accordingly, the direction that the vibration element 14 tries to be bent and the direction that the vibration plate 12 tries to be bent become opposite to each other, and thus, vibration of the vibration element 14 is interrupted due to stress generated at this time, and vibration of the vibration plate 12 becomes weak. In the piezoelectric vibration device of the embodiment, since the first connecting member 13 is formed of a material that is softer than that of the vibration plate 12 and is easy to be deformed, it is possible to reduce interruption of vibration of the vibration element 14 and to strongly vibrate the vibration plate 12.

Furthermore, in the piezoelectric vibration device of the embodiment, the vibration plate 12 is fixed to the support body 11 via the second connecting member 16 capable of transmitting the vibration and the vibration plate 12 and the support body 11 vibrate together due to the bending vibration of the vibration element 14. Accordingly, the amplitude of the vibration plate 12 can be reduced, a mass of the vibrating object can be increased and the vibration energy can be increased. Accordingly, the sound generated from the vibration plate 12 can be reduced, and the piezoelectric vibration device capable of generating strong vibration can be obtained.

In the piezoelectric vibration device of the embodiment, one main surface of the plate-like vibration element 14 capable of being independently subjected to bending vibration is connected to one main surface of the vibration plate 12 via the deformable first connecting member 13 by application of the electric signal. According to the configuration, it is possible to make the device thinner compared to the piezoelectric vibration device of the related art, and even though the vibration element 14 is mounted to only one main surface of the vibration plate 12, strong vibration can be generated.

In addition, the portable terminal of the embodiment has an electronic circuit (not shown), a display 18 and the casing 19 accommodating the electronic circuit or the like in addition to the piezoelectric vibration device. In addition, the vibration plate 12 is a cover of the display 18 and the casing 19 functions as the support body 11 of the piezoelectric vibration device. The portable terminal of the embodiment having such a configuration has the piezoelectric vibration device capable of having a low profile and of generating the strong vibration so that the portable terminal capable of having a low profile and of generating the strong vibration can be obtained. In addition, since the vibration element 14 is not required to be mounted to the front side of the vibration plate 12 that is the cover of the display 18, the portable terminal having an excellent appearance can be obtained. In addition, the display 18 may have an input device such as a touch panel and the cover of the display 18 may have the input device such as the touch panel.

Further, the portable terminal of the embodiment transmits sound information by making contact with the ear directly or through a different object to transmit vibration to a cartilage of the ear with the vibration plate 12 or the casing 19. That is, the portable terminal of the embodiment transmits sound information by making contact with the ear directly or indirectly to transmit vibration to a cartilage of the ear with the vibration plate 12 or the casing 19. Thus, it is possible to achieve a portable terminal capable of transmitting sound information even in a noisy environment, for example. The object interposed between the vibration plate 12 or the casing 19 and the ear may be a cover of the portable terminal, or may be a headphone or an earphone, for example. As long as the object is capable of transmitting vibration, anything may be used.

MODIFIED EXAMPLES

The invention is not limited to the above-described embodiments, and various changes and modifications may be made in a range without departing from the scope of the invention.

For example, in the above-described embodiment, an example in which the cover of the display 18 is the vibration plate 12 has been described, but the invention is not limited thereto. For example, the entirety of the display 18 or a part of the display 18 may be used to function as the vibration plate 12.

Further, in the above-described embodiment, an example in which the casing 19 of the portable terminal functions as the support body 11 of the piezoelectric vibration device has been described, but the invention is not limited thereto. For example, a part of the casing 19 may function as the support body 11 of the piezoelectric vibration device, or a configuration in which the support body 11 of the piezoelectric vibration device is mounted to the casing 19 may be used.

Furthermore, in the above-described embodiment, an example in which the vibration element 14 is configured of the piezoelectric bimorph element has been described, but the invention is not limited thereto. The vibration element 14 may have a function of being independently subjected to bending vibration by application of the electric signal. Accordingly, for example, the invention may be applied to a vibration element having a unimorph structure in which a metal plate is bonded to the piezoelectric body which is subjected to stretching vibration by application of the electric signal.

Figure 8:
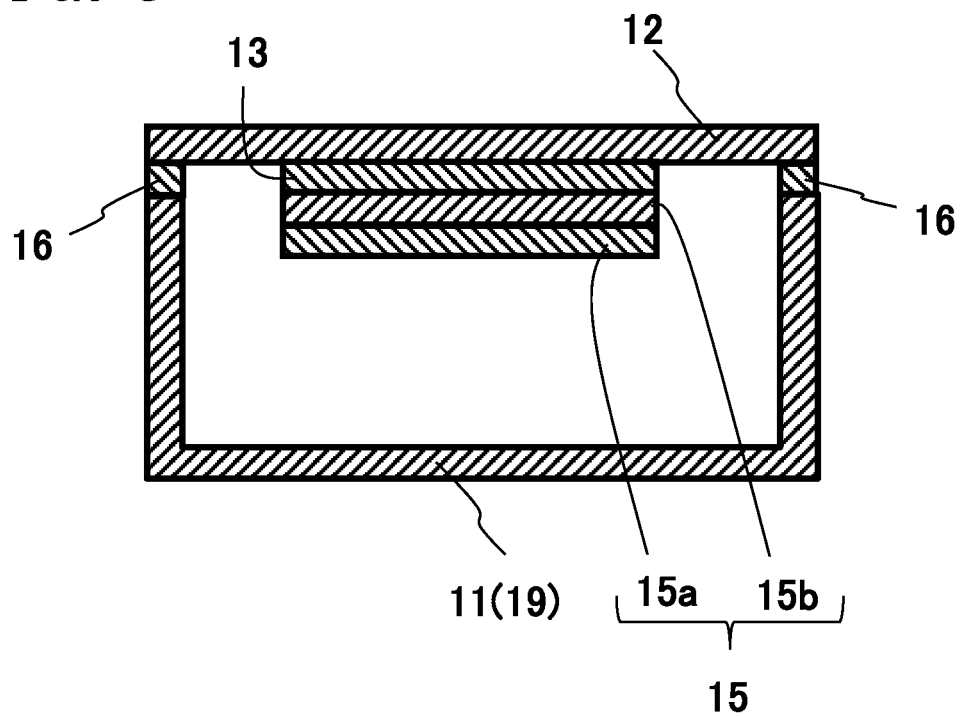
FIG. 8 is a perspective view schematically illustrating a piezoelectric vibration device and a portable terminal according to a modified example of the invention.

FIG. 8 is a schematic perspective view illustrating a piezoelectric vibration device according to a modified example of the invention. The piezoelectric vibration device illustrated in FIG. 8 has a vibration element 15 in which a piezoelectric body 15a and a metal plate 15b are bonded together. The piezoelectric body 15a is configured in which the piezoelectric body layer and the electrode layer are stacked, similar to the vibration element 14 described above, however, all polarization directions are the same with respect to the direction of the electric field which is applied at a certain moment. Accordingly, for example, the piezoelectric body 15a is subjected to stretching vibration in a length direction thereof by application of the electric signal. At this time, since the metal plate 15b bonded to the piezoelectric body 15a is not stretched, the vibration element 15 can be independently subjected to bending vibration by application of the electric signal.

In addition, for example, in the vibration element 15 of the piezoelectric vibration device illustrated in FIG. 8, the metal plate 15b may be replaced with a piezoelectric body layer which is not polarized. As described above, the vibration element 15 having the unimorph structure in which the piezoelectric body which is subjected to stretching vibration, and the piezoelectric body layer which is not subjected to stretching vibration by application of the electric signal are bonded, can be also independently subjected to bending vibration by application of the electric signal.

EXAMPLE

Next, a specific example of the piezoelectric vibration device of the invention will be described. A characteristic of a piezoelectric vibration device according to the first embodiment of the invention shown in FIGS. 1 to 3 was measured.

First, the piezoelectric vibration device of the embodiment of the invention illustrated in FIGS. 1 to 3 was manufactured by mounting the vibration element 14 on the position of an electromagnetic receiver of the rear surface of a liquid crystal display cover of a mobile phone. The vibration plate 12 used the liquid crystal display cover without any change and the casing 19 (the support body 11), and the display 18 also used the ones of the mobile phone without any change. The vibration plate 12 was an acrylic resin of which the length was 95 mm, the width was 48 mm and the thickness was 0.5 mm. The vibration element 14 was a rectangular parallelepiped shape of which the length was 23.5 mm, the width was 3.3 mm and the thickness was 0.5 mm. In addition, the vibration element 14 had a structure in which the piezoelectric body layer 24 and the internal electrodes 21, 22 and 23 having the thickness of approximately 30 pm were alternately stacked, and the total number of the piezoelectric body layers 24 was sixteen. The piezoelectric body layer 24 was formed of lead zirconate titanate (PZT) in which Zr is replaced in part with Sb. For the first connecting member 13, a material used in which adhesive layer composed of acrylic adhesive was disposed on both surfaces of the base material composed of a non-woven fabric which was impregnated with the acrylic adhesive and of which the thickness was 0.16 mm. In addition, the first connecting member 13 was connected to the entirety of one main surface of the vibration element 14. For the second connecting member 16, a material used in which the acrylic adhesive was disposed on both surfaces of the base material composed of a foam and of which the thickness was 0.15 mm. The casing 19 (the support body 11) was made of a synthetic resin.

Figure 9:
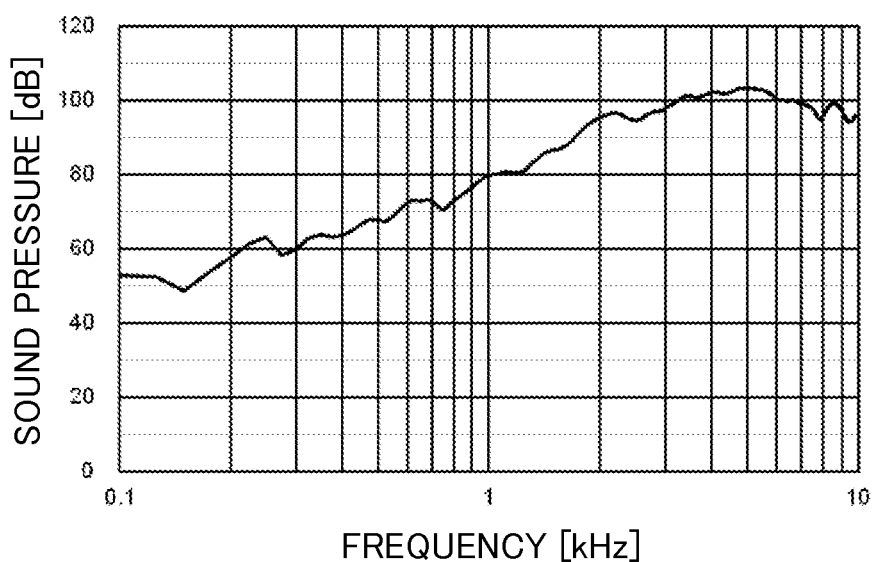
FIG. 9 is a graph illustrating a measurement result of characteristics of the piezoelectric vibration device of the embodiment of the invention.

Then, a frequency characteristic of sound pressure of the manufactured piezoelectric vibration device was evaluated. In evaluation, a silicone rubber having a thickness of 2 mm and the same area as that of the vibration plate 12 was disposed on the vibration plate 12, and a microphone was pressed to be mounted at a position directly above the vibration element 14 on an upper surface of the silicone rubber. Further, a sine wave signal having an effective value of 3.0 V was inputted to the vibration element 14, and sound pressure detected by the microphone was evaluated. The result is shown in FIG. 9. In the graph of FIG. 9, the horizontal axis represents frequency, and the vertical axis represents sound pressure. According to the graph shown in FIG. 9, it is confirmed that high sound pressure exceeding 40 dB in a wide frequency wave is obtained. Thus, effectiveness of the invention was confirmed.

REFERENCE SIGNS LIST

11: Support body
12: Vibration plate
13: First connecting member
14, 15: Vibration element
16: Second connecting member
18: Display
19: Casing

What is claimed is:

1. A piezoelectric vibration device, comprising at least:
a support body;
a vibration member including a primary surface, a periphery of the primary surface being fixed to the support body;
a vibration element capable of being independently subjected to bending vibration; and
a deformable first connecting a first surface that is a bending surface of the vibration element and the primary surface of the vibration member, and the deformable first connecting member being lower in rigidity than the vibration member and including a first main surface and a second main surface, the first main surface of the deformable first connecting member being entirely connected to the first surface of the vibration element, the second main surface of the deformable first connecting member being entirely connected to a portion of the primary surface of the vibration member,
the vibration member being vibrated by the vibration element to generate sound information.

2. The piezoelectric vibration device according to claim 1, wherein a thickness of the deformable first connecting member is greater than amplitudes of the bending vibration of the vibration element.

3. The piezoelectric vibration device according to claim 1, wherein the vibration element vibrates by application of an electric signal, and a portion of the vibration member to which the vibration element is mounted vibrates with an amplitude smaller than that of the vibration element.

4. The piezoelectric vibration device according to claim 1, wherein the vibration member is fixed to the support body via a second connecting member capable of transmitting the vibration, and the vibration member and the support body vibrate together due to the bending vibration of the vibration element.

5. A portable terminal, comprising at least:
an electronic circuit;
a display;
the piezoelectric vibration device according to claim 1 and
a casing, the vibration member being the display, a part of the display, or a cover of the display, and
the support body being fixed to the casing or at least a part of the casing being the support body.

6. The portable terminal according to claim 5, wherein the vibration member or the casing makes contact with an ear directly or through a different object to transmit sound information.

* * * * *